United States Patent
Detering et al.

(10) Patent No.: US 6,850,121 B1
(45) Date of Patent: Feb. 1, 2005

(54) TDMA TRANSMIT FREQUENCY GENERATOR SUPPRESSING FREQUENCY JUMPS CAUSED BY FEEDBACK

(75) Inventors: Volker Detering, Emmerich (DE); Stefan Heinen, Krefeld (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/018,796
(22) PCT Filed: May 30, 2000
(86) PCT No.: PCT/DE00/01759
§ 371 (c)(1), (2), (4) Date: Dec. 21, 2001
(87) PCT Pub. No.: WO01/01562
PCT Pub. Date: Jan. 4, 2001

(30) Foreign Application Priority Data

Jun. 24, 1999 (DE) .......................................... 199 28 998

(51) Int. Cl.⁷ ............................. H03B 21/00; H04B 1/26
(52) U.S. Cl. ............................. 331/37; 331/40; 327/255; 455/323
(58) Field of Search ......................... 331/37, 40, 74–77; 327/238, 254, 255; 455/255, 256, 313, 323, 333

(56) References Cited

U.S. PATENT DOCUMENTS

| | | |
|---|---|---|
| 4,105,949 A | 8/1978 | Hardin |
| 5,179,359 A | 1/1993 | McLeod |
| 5,220,557 A * | 6/1993 | Kelley ........................ 370/345 |
| 5,307,029 A * | 4/1994 | Schenk ........................ 331/37 |

FOREIGN PATENT DOCUMENTS

| | | |
|---|---|---|
| DE | 25 23 131 | 12/1976 |
| DE | 195 43 844 | 6/1996 |

* cited by examiner

*Primary Examiner*—David Mis
(74) *Attorney, Agent, or Firm*—Staas & Halsey LLP (57) ABSTRACT

A transmit frequency is generated for a transceiver by a controllable oscillator which generates an oscillator frequency, a divider by a factor N, and a mixer stage with a subsequent band filter. Signals with the oscillator frequency and the oscillator frequency divided by the factor N are to the mixer stage to generate an output signal at the transmit frequency.

20 Claims, 10 Drawing Sheets

TDMA TRANSMIT FREQUENCY GENERATOR SUPPRESSING FREQUENCY JUMPS CAUSED BY FEEDBACK

CROSS REFERENCE TO RELATED APPLICATIONS

This application is based on and hereby claims priority to German Patent Application No. 19928998 filed on Jun. 24, 1999, the contents of which are hereby incorporated by reference.

BACKGROUND OF THE INVENTION

1. Field of the Invention

The invention relates to an electronic circuit for generating a transmit frequency for a transceiver.

2. Description of the Related Art

The inventors are familiar with similar circuits from the prior art for generating corresponding transmit frequencies in a TDMA radio system (for example DECT, GSM, PHS). The abbreviation TDMA stands for "Time Division Multiple Access". A typical circuit is composed of an oscillator for generating frequencies, a transmit amplifier, a receiver and a control device which determines the chronological sequence of alternating transmit and receive states. In general, the oscillator frequency for setting the transmission channel via the control device using a PLL (phase locked loop) is set before the switching on of the transmitter since, for technical reasons, a certain setting time is required for this process. The invention relates to the case of transmission in such a TDMA system as illustrated schematically in FIG. 1.

The problem of such a simple circuit is that the generation of frequencies is disrupted at the moment of the switching on of the transmit amplifier owing to the load change in the amplifier or due to feedback. As a result, an undesired frequency jump is generated. Such a load change occurs, for example, during the switching on of the transmit amplifier as a result of the change in its input impedance. An effect on the generation of frequencies can arise, for example, owing to irradiation by the antenna, or due to other coupling parts between the transmit output stage and the generation of frequencies, for example due to the supply voltage.

In particular in TDMA systems which, for costs reasons, operate with a slow PLL control loop, or open the control loop for the duration of the modulation, this effect is a large problem for the implementation because the frequency jump can no longer be corrected by the PLL circuit. An example of this is the open-loop modulation of a DECT system.

Figure 2:
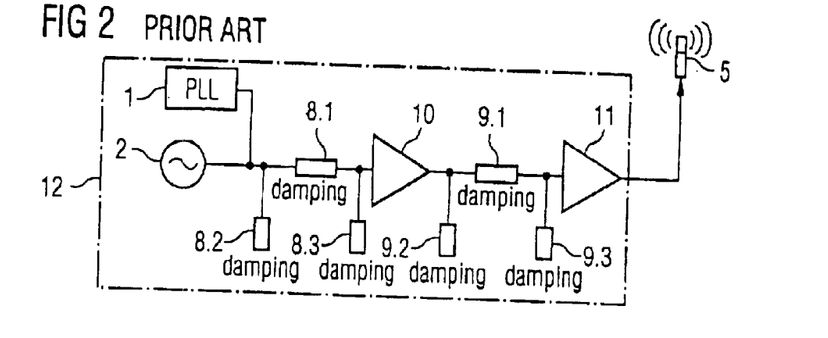

The abovementioned problem is tackled by various circuits known to the inventors. For example, there is a possibility of bringing about a reduction in the load change which is visible for the generation of frequencies by inserting damping elements and isolating stages between the frequency generating components and the transmit amplifier. In addition, additional shielding of the frequency generating components in the form of a Faraday cage can ensure that the irradiation is reduced. Furthermore, additional blocking against electromagnetic irradiation, for example by specially shaped plugs, can be provided on the lines which lead into the shield. An example of such a known circuit device is shown in FIG. 2.

It is also known that the insertion of frequency multiplication stages or divider stages in the frequency generating components prevents the feedback and thus the influence on the frequency generating components. Here, an oscillator oscillates at a harmonic or subharmonic of the desired frequency, as a result of which both a low load dependence and a lower sensitivity to the irradiation of undesired frequencies is produced in accordance with the degree of multiplication or division. This circuit is illustrated schematically in FIG. 3.

Figure 4:
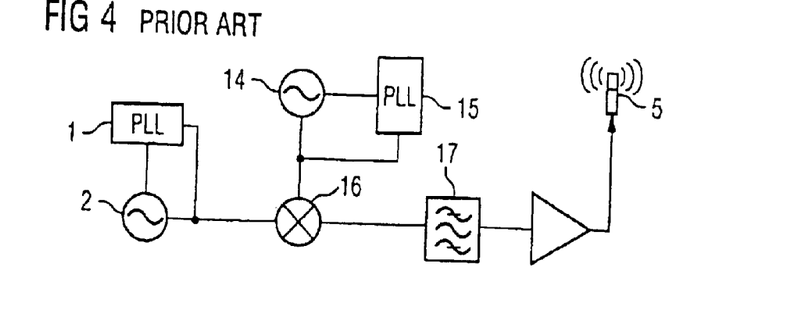

Finally, the relatively costly use of a transmission mixing concept, such as is illustrated schematically in FIG. 4, for solving the abovementioned problem is known to the inventors.

In this transmission mixing concept, the frequencies of two oscillators are mixed in a mixer stage and the desired frequency filtered out from the mixing products. Because the oscillators have a nonharmonic relationship with the desired frequency, there is a resulting high degree of immunity to the load changes and effects. As a result, the requirements made of the shielding, the blocking and the isolation stages are reduced considerably in comparison with the known solutions from FIGS. 2 and 3.

The greatest disadvantage of this transmission mixing concept is the large degree of technical expenditure which it requires because a transmission mixer stage, an oscillator including a PLL circuit for frequency stabilization and a band filter are additionally required. The additionally required electronic components alone result in a considerable cost disadvantage in comparison with the two preceding solutions.

A further disadvantage of this more costly transmission mixing concept is that the overall size of such a circuit is too large owing to the number of additional electronic components.

In this transmission mixing concept, it proves particularly difficult to achieve a high degree of integration because given the current state of the art the filters and oscillators or oscillator coils are very difficult to accommodate in integrated circuits, or require a very large chip area. In addition, it is frequently impossible to integrate to a sufficient degree the capacitors and resistors which are required for the PLL so that they have to be arranged as external components.

Because a total of two oscillators for frequency stabilization, two PLLs, including two external loop filters, are necessary in the known transmission mixing concept, and in particular oscillators with a low frequency require a particularly large chip area or have poor properties with respect to phase noise, this transmission mixing concept proves relatively unsuitable for a high integration density.

SUMMARY OF THE INVENTION

The object of the invention is therefore to disclose an electronic circuit for generating a transmission frequency which on the one hand offers the favorable technical requirements of the transmission mixing concept and on the other hand permits a high integration density of the circuit to be achieved, and thus makes cost-effective manufacture possible.

Accordingly, an electronic circuit is proposed for generating a transmit frequency $f_s$ for a transceiver, which circuit contains the following components: a controllable oscillator for generating an oscillator frequency $f_{osz}$, a divider by a factor N and a mixer stage with a subsequent band filter, the components being connected to one another in such a way that the oscillator frequency $f_{osz}$ and an oscillator frequency $f_{osz}/N$ divided by the factor N are fed to the mixer as input signals and output by it as transmit frequency $f_s$.

A significant advantage of this circuit is that a lower phase noise is produced with the circuit according to the invention than would be achievable with the two oscillators of the known transmission mixing concept because only a single oscillator can contribute to the phase noise.

A simplification of the structure of the circuit is achieved by virtue of the fact that, instead of the mixer stage with subsequent band filter, a single-sideband mixer or Image Reject Mixer is used. Single-sideband mixers are available as ready-made components and can be integrated into the circuit structure in a compact fashion.

A further advantageous refinement of the electronic circuit according to the invention can consist in using a PLL circuit for stabilization, to which PLL circuit a reference frequency, and either the oscillator frequency or the output frequency of the band filter or if appropriate of the single-sideband mixer, are fed as input signals.

Furthermore, it may be advantageous if the factor N of the divider supplies a multiple of the number 2 and/or is greater than 1 and supplies two output signals which are phase-shifted with respect to one another by 90°.

The desired phase shift by 90° can be achieved by phase shifting part of the signal by 90° and maintaining the original phase for the remaining part of the signal, or by phase shifting both parts of the signal by +45° and −45°, respectively. In both cases, a phase difference of 90° remains.

A further advantageous refinement of the electronic circuit according to the invention can consist in the fact that a control device is additionally provided which, at the time of the switching on of a transmit output stage connected to the output of the single-sideband mixer, superimposes on an oscillator control signal a data signal for generating a frequency modulation. Such a control device is used, for example, in what is referred to as TDMA systems.

In respect of optimal integration and simple implementation of the circuit it is also advantageous to implement the control device using an ASIC component.

Another advantageous refinement of the circuit provides for the control device to activate two switches alternately, which enables a connection of the oscillator control input either to a data modulator or, for the purpose of channel setting, to the PLL.

Furthermore, an alternative refinement to the electronic circuit according to the invention can consist in the fact that a superimposition receiver is provided which obtains a superimposition frequency directly from the oscillator frequency $f_{osz}$, and that a changeover device is provided which in the case of transmission feeds the single-sideband mixer output frequency and in the case of reception feeds the oscillator frequency to the PLL.

The oscillator can advantageously operate in a voltage-controlled or current-controlled fashion, for example, and if appropriate a reference frequency can also be fed externally.

Of course, the abovementioned features of the invention which are to be explained can be used not only in the respective specified combination but also in other combinations or alone without departing from the scope of the invention.

Further features and advantages of the invention emerge from the following description of preferred exemplary embodiments with reference to the drawings.

BRIEF DESCRIPTION OF THE DRAWINGS

The invention will be explained below in more detail with reference to the drawings, in which, in particular.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

Figure 1:
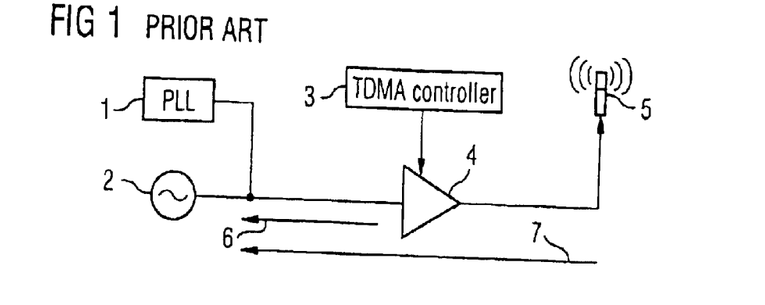
FIGS. 1–4 are circuit diagrams from the prior art.

FIG. 1 shows a known circuit for a TDMA radio system with an oscillator 2 and a PLL circuit 1 for generating a frequency which is as stable as possible, a TDMA controller 3 of a transmitting amplifier 4 and an antenna 5.

In this circuit, at the moment of the switching on of the transmitting amplifier 4, the generation of frequencies is disrupted owing to a load change and/or effects—indicated by the arrows 6 and 7—and an undesired frequency jump is produced. The load change occurs during the switching on of the transmitting amplifier 4 as a result of the change in its input impedance.

Effects on the frequency generating components are produced as a result of the irradiation by the antenna 5, or by other coupling paths (not illustrated here) between the transmit output stage and the frequency generating components. An example of this are the supply voltage feeder lines.

FIG. 2 shows a known circuit for avoiding the frequency jump. The circuit contains, in addition to the components illustrated in FIG. 1, the damping elements 8, 9 and one or more further amplifier stages for reducing the load change which is visible to the frequency generating components. Additional shielding (Faraday Cage) 12 of the frequency generating components for reducing irradiation is also illustrated. Furthermore, there is usually high frequency blocking (not illustrated here) of the lines leading into the shielding.

Figure 3:
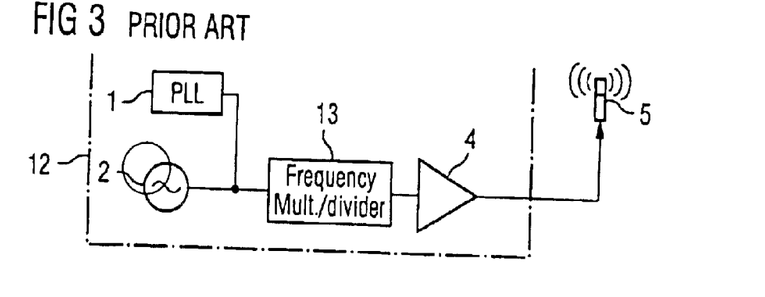

FIG. 3 shows a further known variant of a frequency generating circuit with a frequency multiplication stage or divider stage 13. In this example, the oscillator 2 oscillates at a harmonic or subharmonic of the desired transmit frequency, as a result of which both a lower load dependence and a lower sensitivity to electromagnetic irradiation arises in accordance with the degree of multiplication or division.

The best known circuit with the most effective suppression of feedback and frequency jumps during the switching on of the transmitting amplifier is illustrated in FIG. 4. This FIG. 4 shows a circuit for generating a transmit frequency using a transmission mixing concept. Here, the frequency of the first oscillator 2 and to the first PLL circuit 1, and the second frequency of the second oscillator 2 and to the second PLL circuit 15 is mixed in the mixer stage 16, and the desired frequency is filtered out of the mixing products by the band filter 17.

If the frequencies of the oscillators 2 and 14 are selected such that they have a nonharmonic relationship with the desired frequency, there is a resulting high degree of immunity to load changes, that is to say during the switching on of the transmitting amplifier, and to its effects. As a result, the requirements made of the shielding, blocking and isolating stages are reduced considerably in comparison with the circuits illustrated in FIGS. 2 and 3. The expenditure on circuitry is disadvantageous because a mixer stage 16, an oscillator 14 and a PLL circuit 15 for frequency stabilization and a band filter 17 are additionally required.

Figure 5:
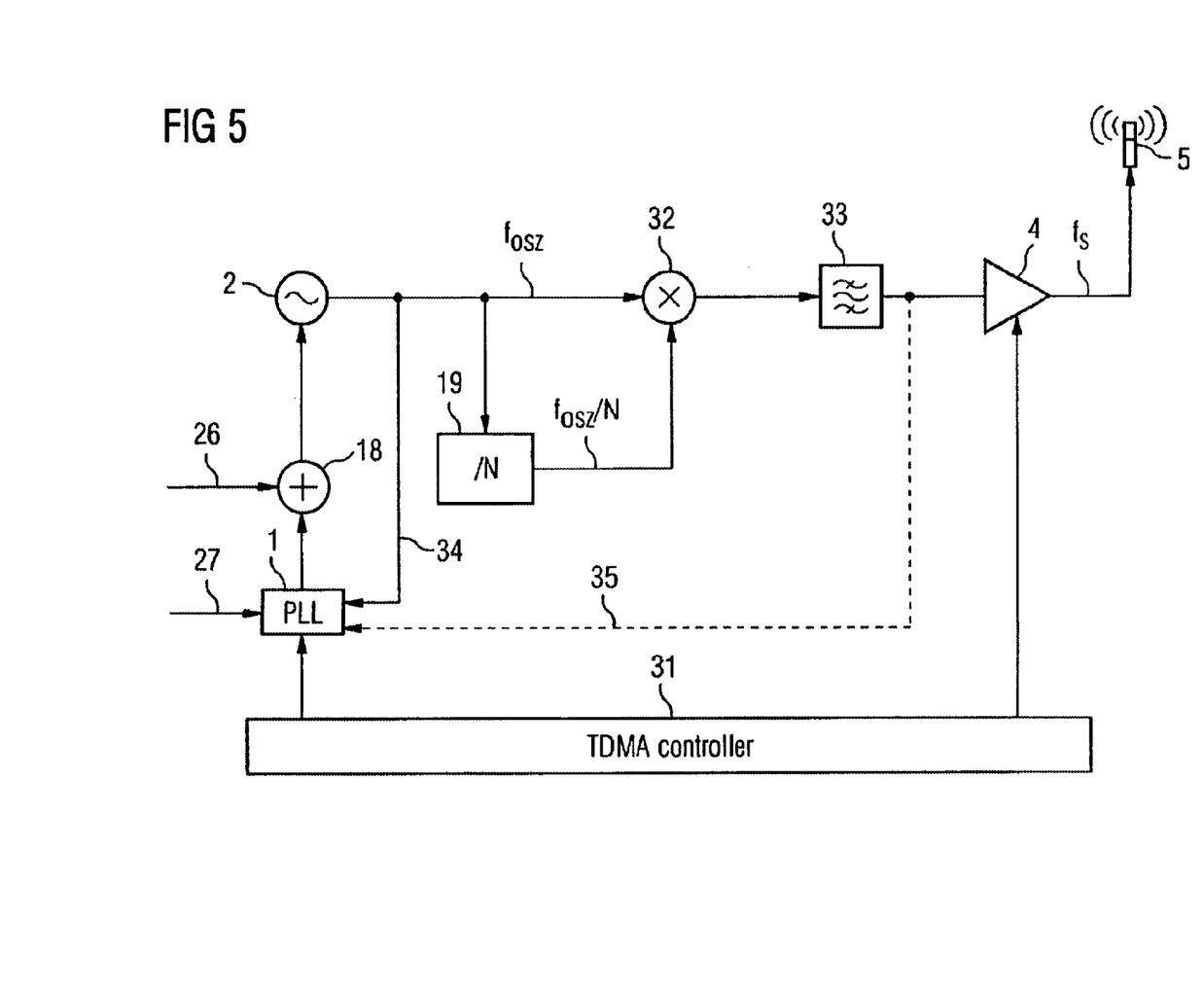
FIG. 5 is a circuit diagram for a circuit with a mixer and subsequent band filter.

FIG. 5 shows a simple circuit according to the invention for a radio system in which a high degree of cost savings can be achieved by a good degree of integration. The transmission mixing concept was selected as a starting point, but the second oscillator was dispensed with.

The second arrangement is composed, at the input end, of a single oscillator 2 which is stabilized by a PLL circuit 1. A summing stage 18, by which an FM modulation signal 26 can be supplied, is arranged between the oscillator 2 and the PLL circuit 1. The frequency $f_{osz}$ of the oscillator 2 is fed to a frequency divider 19, and the frequency $f_{osz}/N$ is generated. Both frequencies $f_{osz}$ and $f_{osz}/N$ are then fed to a mixer 32 in order to form the transmit frequency $f_s$. In the subsequent band filter 22, the undesired secondary frequencies which have also been produced are filtered out and the filtered frequency is conducted to the amplifier output stage 4. Either the oscillator frequency $f_{osz}$ can be fed back to the PLL circuit 1 via the line 34, or the transmit frequency $f_s$ can be fed back to the PLL circuit 1 from the output of the band filter 33.

The desired transmit frequency $f_s$ is thus obtained by:

$$f_s = f_{osz} \pm (f_{osz}/N) = f_{osz} * (1 \pm 1/N)$$

where fs=transmit frequency, $f_{osz}$=oscillator frequency, N=divider factor

As is apparent from the mathematical relationship, a nonintegral relationship results between the transmit frequency $f_s$ and the oscillator frequency $f_{osz}$, which promises a good degree of immunity to effects. The selection of the signs in the formula is determined by the connection of the single-sideband mixer. There is the freedom to allow the oscillator to oscillate either below or above the desired frequency. Basically, the oscillator frequency $f_{osz}$ can also be selected in such a way that the oscillator frequency $f_{osz}$ fulfils the criterion of the best phase noise (best quality of the coil) given the equipment.

In addition to the circuit according to the invention for generating the transmit frequency, a TDMA controller 31, known per se, for which the circuit for generating frequencies according to the invention is particularly suitable is also illustrated in FIG. 5.

Figure 6:
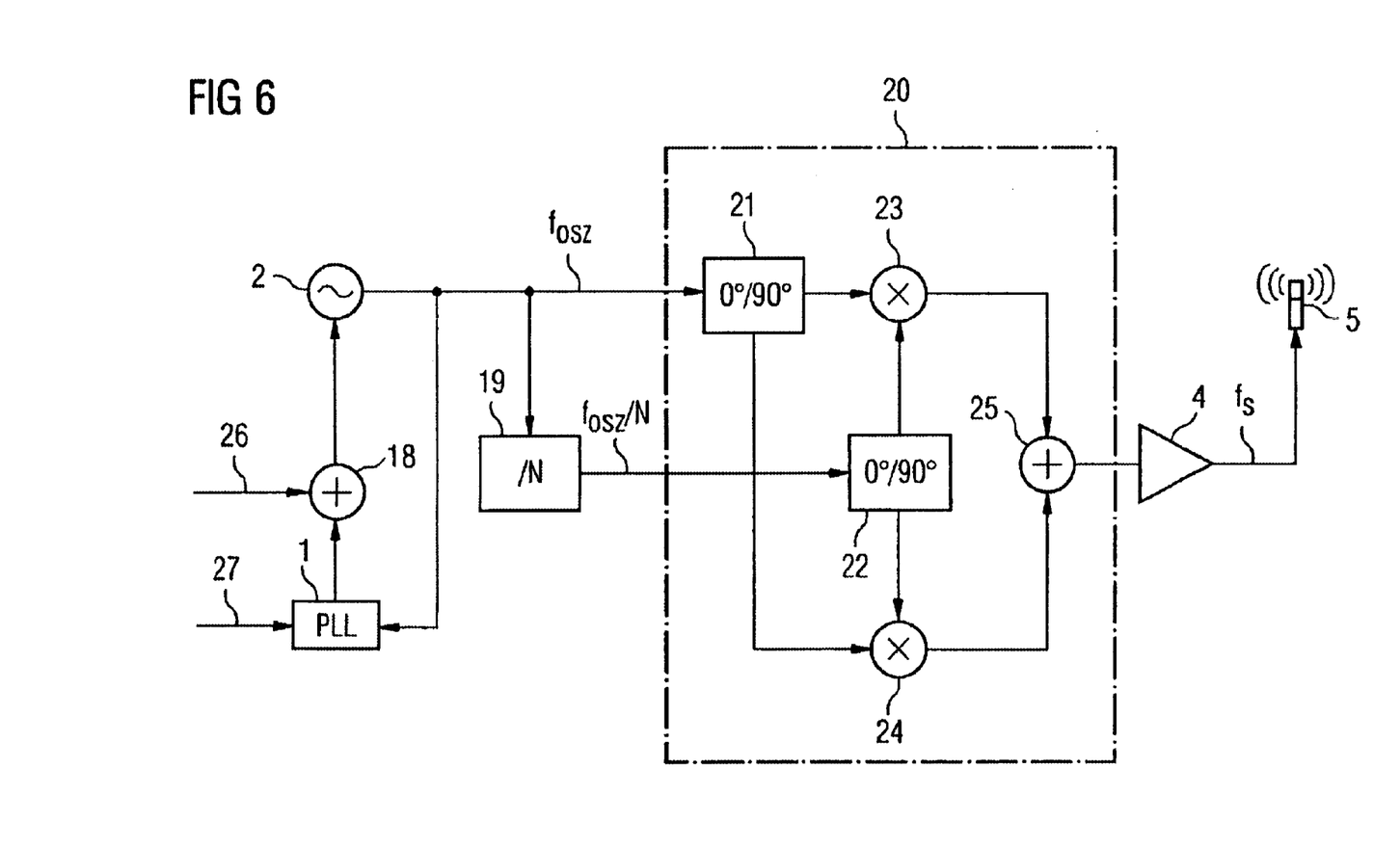
FIG. 6 is a circuit diagram for a circuit with single-sideband mixer.

FIG. 6 shows a further development of the circuit according to the invention from FIG. 5.

In this further development, a single-sideband mixer or Image Reject Mixer 20 was used instead of the mixer 32 and the subsequent band filter 33. If the operating conditions require it, another filter element (not illustrated) for suppressing the harmonics of the divided signal can also be used downstream of the divider 19.

The single-sideband mixer 20 typically has a first phase shifter 21 for phase shifting and dividing the incoming oscillator frequency $f_{osz}$ and a second phase shifter 22 for phase shifting the incoming divided oscillator frequency $f_{osz}/N$ by 90° in each case. These frequencies which are each phase-shifted by 90° are mixed in the mixers 23 and 24, superimposed in the summing stage 25 and output as a desired transmit frequency $f_s$.

It is to be noted that the purpose of the phase shifting of 0° and 90° illustrated here can also be achieved by a phase shift by −45 and +45°.

The desired transmit frequency $f_s$ is also obtained here and in all the further examples in accordance with the same formula to be described with respect to FIG. 5.

Since the frequency divider and single-sideband mixer can be integrated without difficulty with the contemporary technologies, this circuit leads to a considerable saving in chip area. Furthermore, there is a saving of a PLL with the external components of the loop filter connected thereto.

Figure 7:
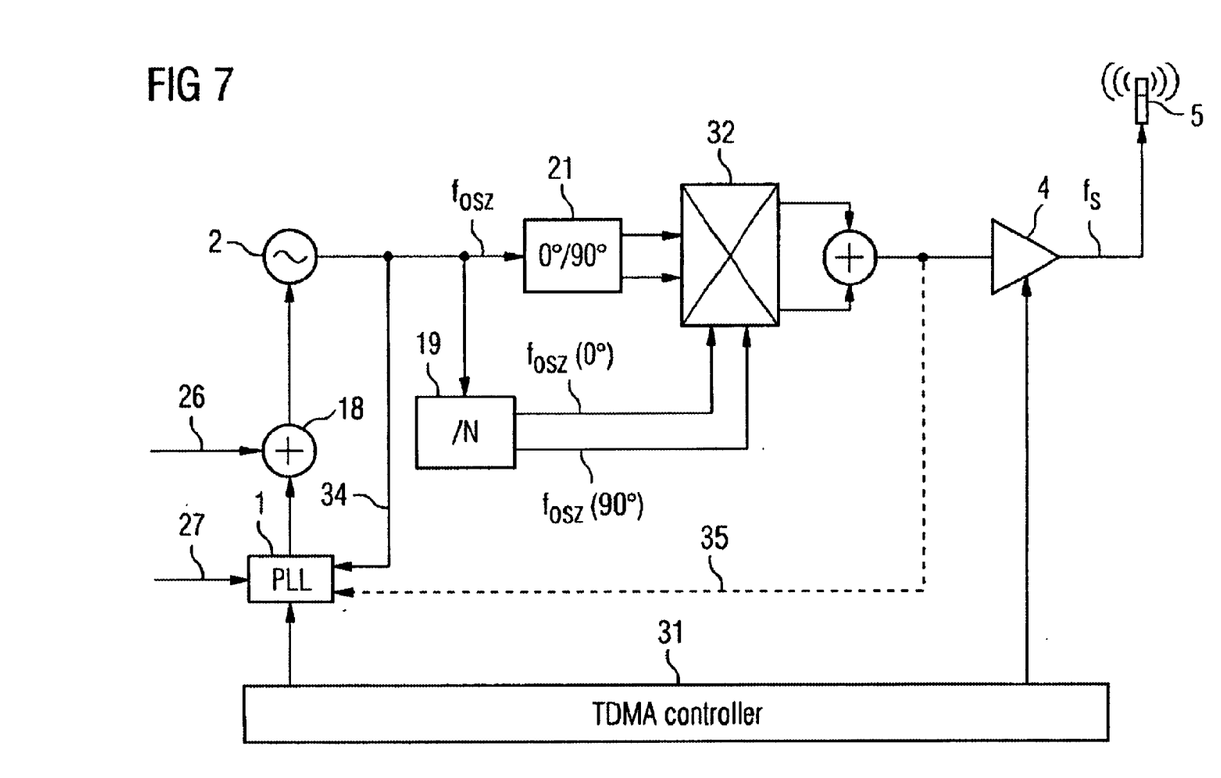
FIGS. 7–10 are circuit diagrams with different modulator arrangements.

Another circuit according to the invention for generating a transmit frequency is illustrated in FIG. 7. The oscillator frequency $f_{osz}$ is fed on the one hand to a divider 19 and on the other hand to a phase shifter 36. By using a factor N which can be divided by two, the phase shift of 90° required for the principle of single-sideband mixing can advantageously be generated easily and precisely, as a result of which there is better suppression of the undesired sideband from the mixing process.

The output signals which are shifted by 90° are obtained in a generally known way in that the last divider stage of a divider chain is a double design, one of the two divider stages being fed the input signal in inverted form.

Figure 8:
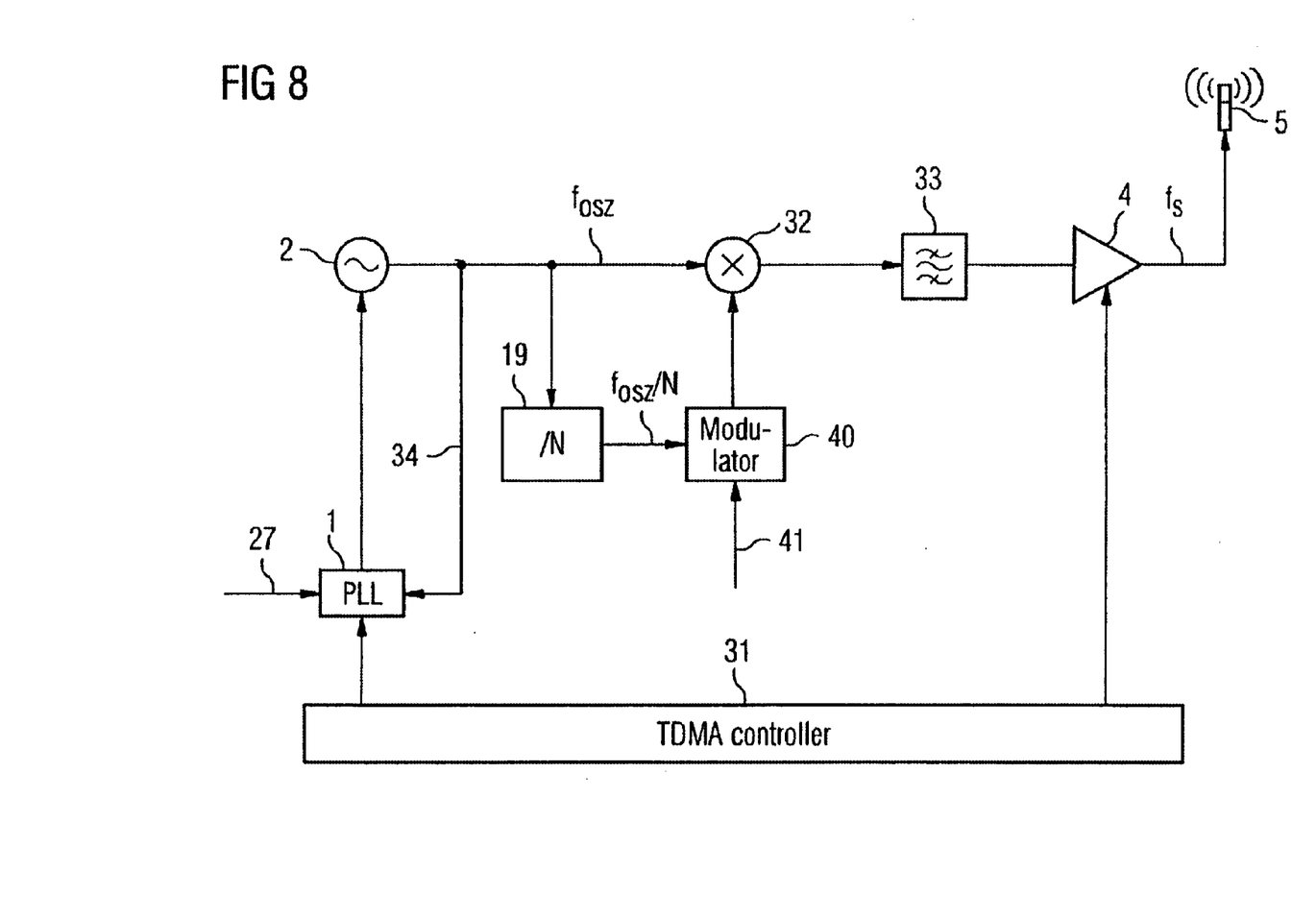

FIG. 8 shows a variant of the simple embodiment of the circuit according to the invention from FIG. 5 with a mixer 33 and downstream band filter 33. The difference with respect to FIG. 5 is that here a modulation signal 41 is emitted to a modulator 40 which is arranged between the divider 19 and mixer 32. This modulator 40 can be embodied, for example, as a vector modulator. The mixer 32 which is illustrated in simplified form contains in practice two individual mixers, each being responsible for one signal.

Such an embodiment has the advantage that any desired, even multivalued types of modulation can be generated with good frequency and/or phase stability.

The modulation signal 4 which is supplied can, for example, be the IQ baseband, generated by a digital signal processor, of a GMSK, N-PSK or quadrature amplitude modulation.

Figure 9:
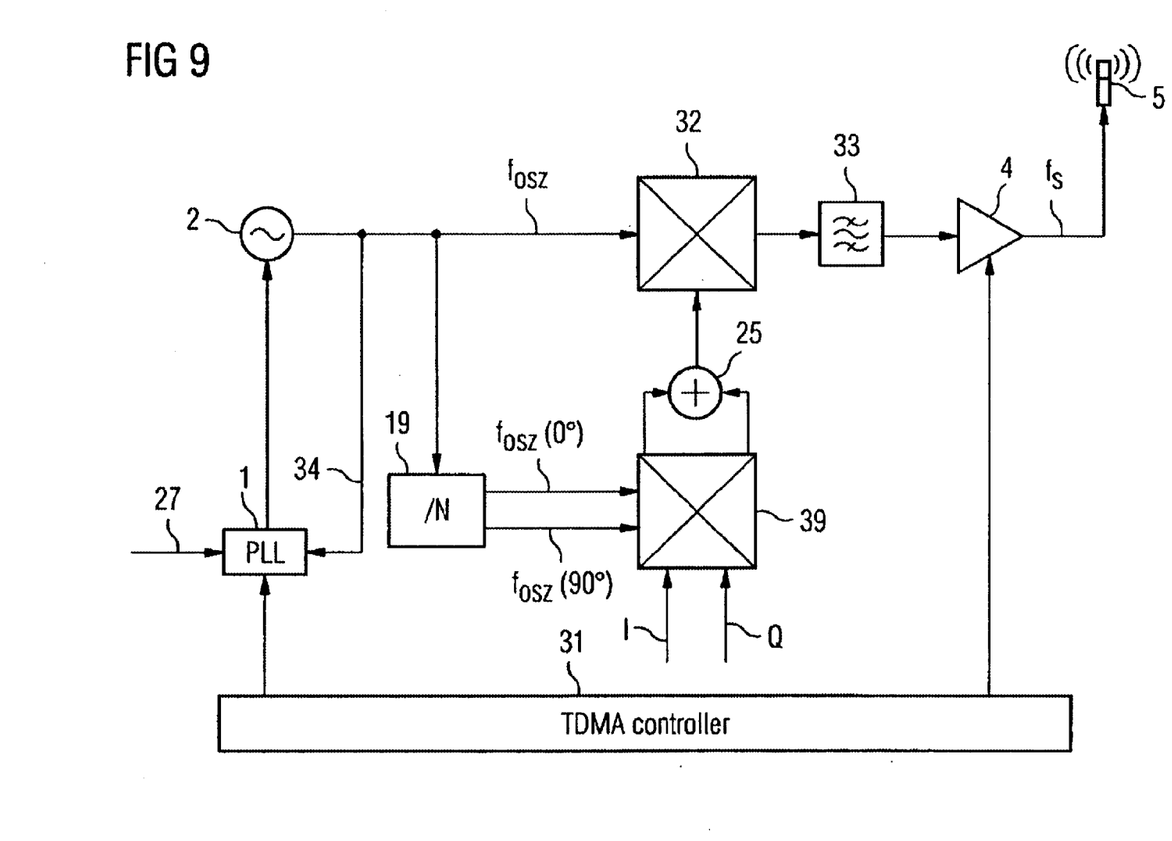

Another modification of the circuit according to the invention is illustrated in FIG. 9. This corresponds essentially to FIG. 5, but here, in order to generate and modulate the transmit frequency, two frequencies $f_{osz}(0°)$ and $f_{osz}(90°)$ which are phase-shifted by 90° and divided by N are fed to a mixer stage 39, which simultaneously operates as a modulator in that it mixes the data signals into baseband conditioning signals I and Q. The output signals are then conducted to the summing stage 25 and fed to the mixer 32. Here, the advantage arises from the precisely generated 0°/90° phase shift from the divider N which is required by the IQ modulator.

In the mixer 32, the transmit frequency $f_s$ including secondary frequencies is in turn generated by mixing with the oscillator frequency $f_{osz}$, the secondary frequencies are largely filtered out during passage through the subsequent band filter 33 and the remaining transmit frequency $f_s$ is conducted to the transmitting amplifier 4 and irradiated via the antenna 5. As in FIG. 5, the optional TDMA controller 31 is also illustrated.

Figure 10:
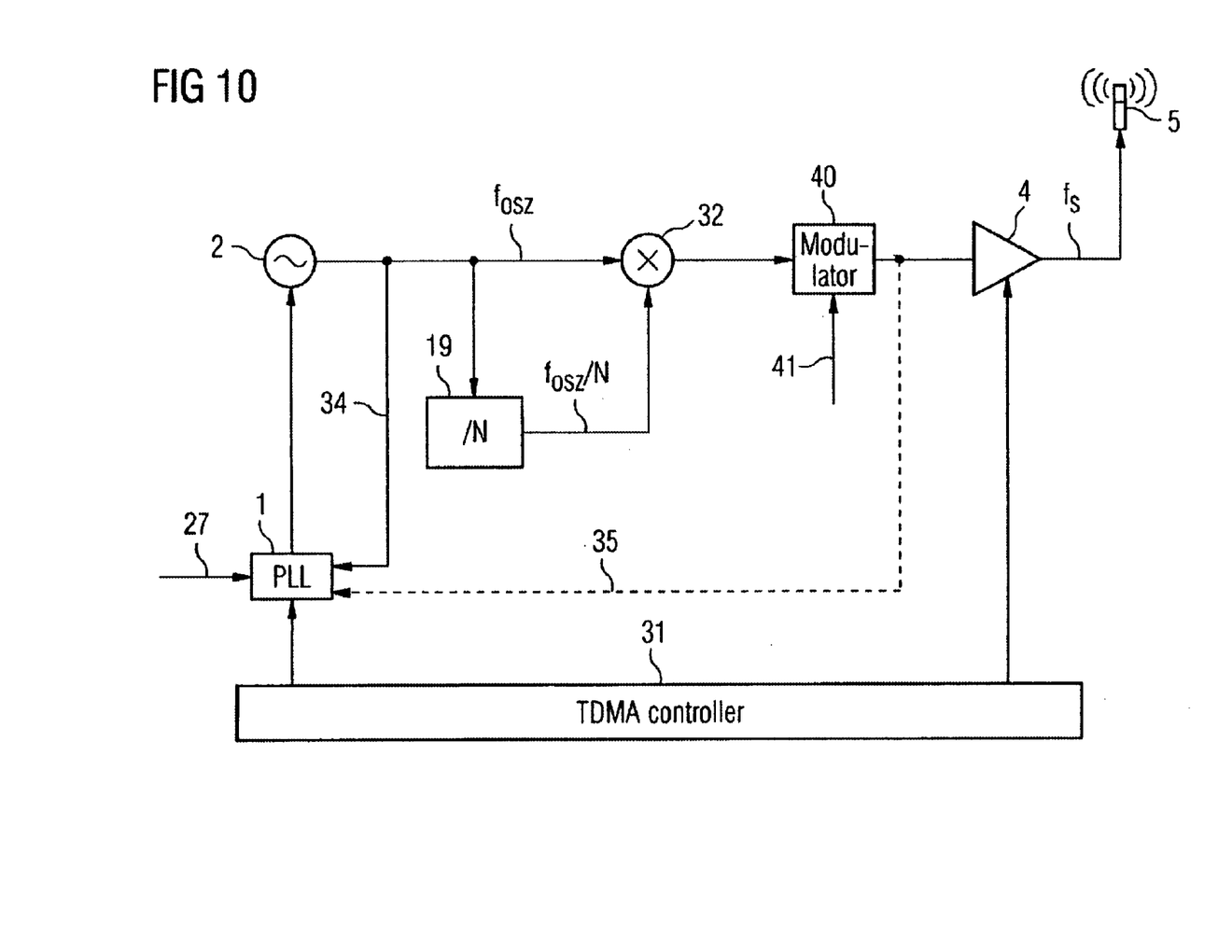

A further possible way of transferring a modulation onto the transmit signal is illustrated in FIG. 10. The circuit also corresponds here to the simple design from FIG. 5, but a modulation is not superimposed on the oscillator frequency, but rather, instead of the band filter 33, a modulator 40, to which a modulation signal 41 is fed by a baseband, is arranged downstream of the mixer 32. This is therefore a "combination" of the design with an IQ modulator with which any desired types of modulation can be implemented, as illustrated in FIGS. 8 and 9.

FIGS. 5 to 10 thus show a very wide variety of possibilities of modulating a transmit frequency $f_s$ generated according to the invention by different types of modulation such as GMSK ( Gaussian minimum shift keying), nPSK ( n-multiple phase shift keying) or QAM (quadrature amplitude modulation).

Figure 11:
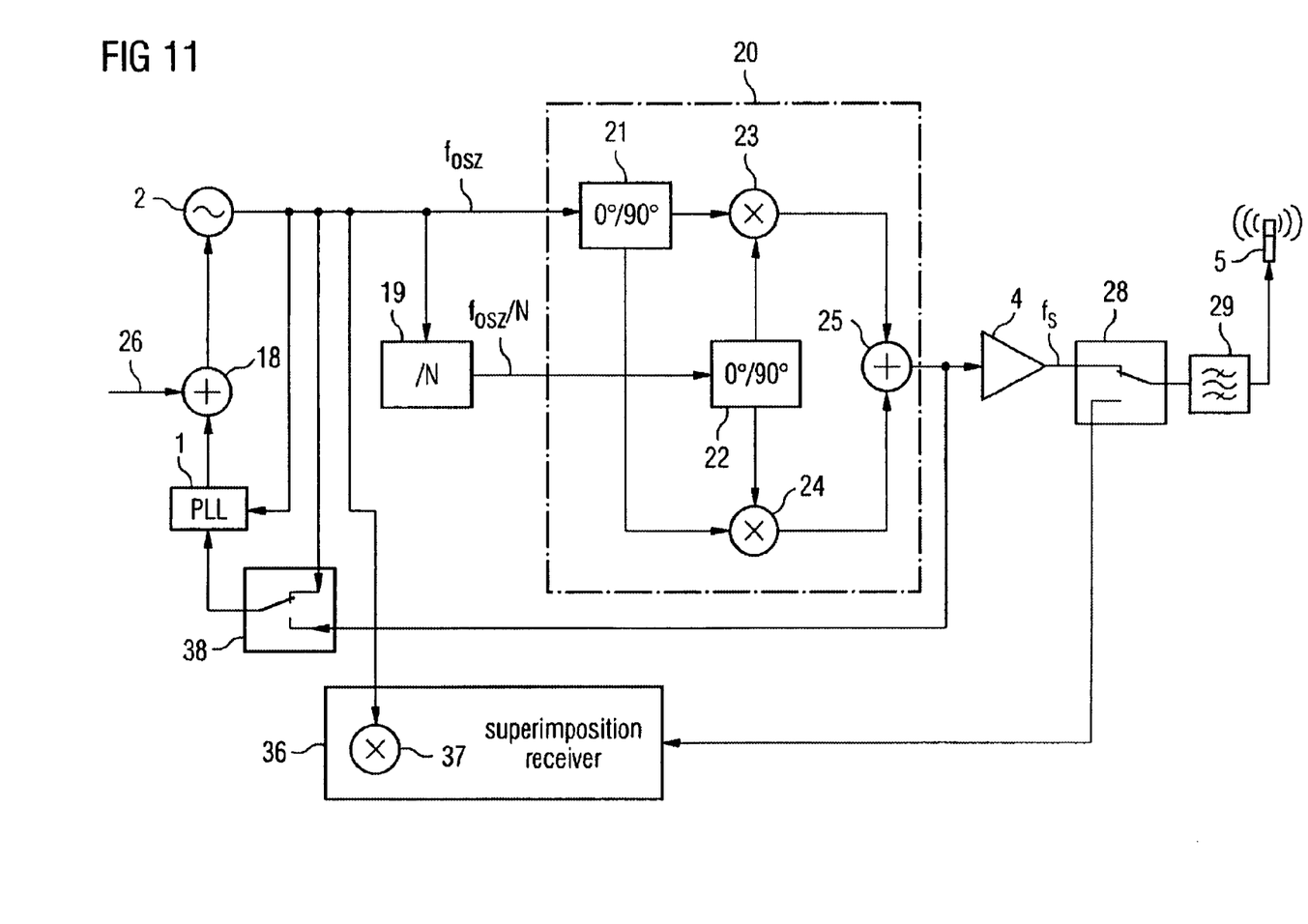
FIG. 11 is a circuit diagram for a circuit with superhet receiver and use of the oscillator at the receiver end.

FIG. 11 shows a further circuit which illustrates a combination of frequency generation with a superhet receiver and provides further advantages. The basic design of the circuit corresponds to the circuit from FIG. 6, but there is additionally a superimposition receiver 36 with integrated receive mixer 37 and the additional changeover switch 38, which permits the same PLL step size in the transmitting and receiving modes.

In the receiving mode, the oscillator 2 generates the superimposition signal, while in the case of transmission the same oscillator 2 is used to generate the transmit frequency. The intermediate frequency in the case of reception is selected in such a way that it lies in the vicinity of the oscillator offset frequency in the case of transmission. The tuning range of the receiver is somewhat smaller in accordance with the offset between the transmit frequency and oscillator frequency, which however has hardly any effect in practice with relatively large divider factors. The coupling with the PLL is carried out by the changeover switch 38, downstream of the single-sideband mixer 20 in the case of transmission and directly by the oscillator 2 in the case of reception, in order to permit a uniform tuning step size of the PLL with the same reference frequency. It is advantageous here that only a single oscillator 2 is necessary for the transmitting mode and the receiving mode and at the same time good stability of the transmit frequency is achieved in the TDMA mode.

This circuit design shown is particularly suitable for DECT systems.

A disadvantage of the circuit according to the invention in comparison with an oscillator which operates at the limit frequency, namely the additional undesired mixing products of a real single-sideband mixer, can be reduced by adding a high-frequency filter, necessary in any case in the receiver, upstream of the transmit/receive changeover switch. In this case, the filter is used both for the transmit branch and for the receive branch.

Figure 12:
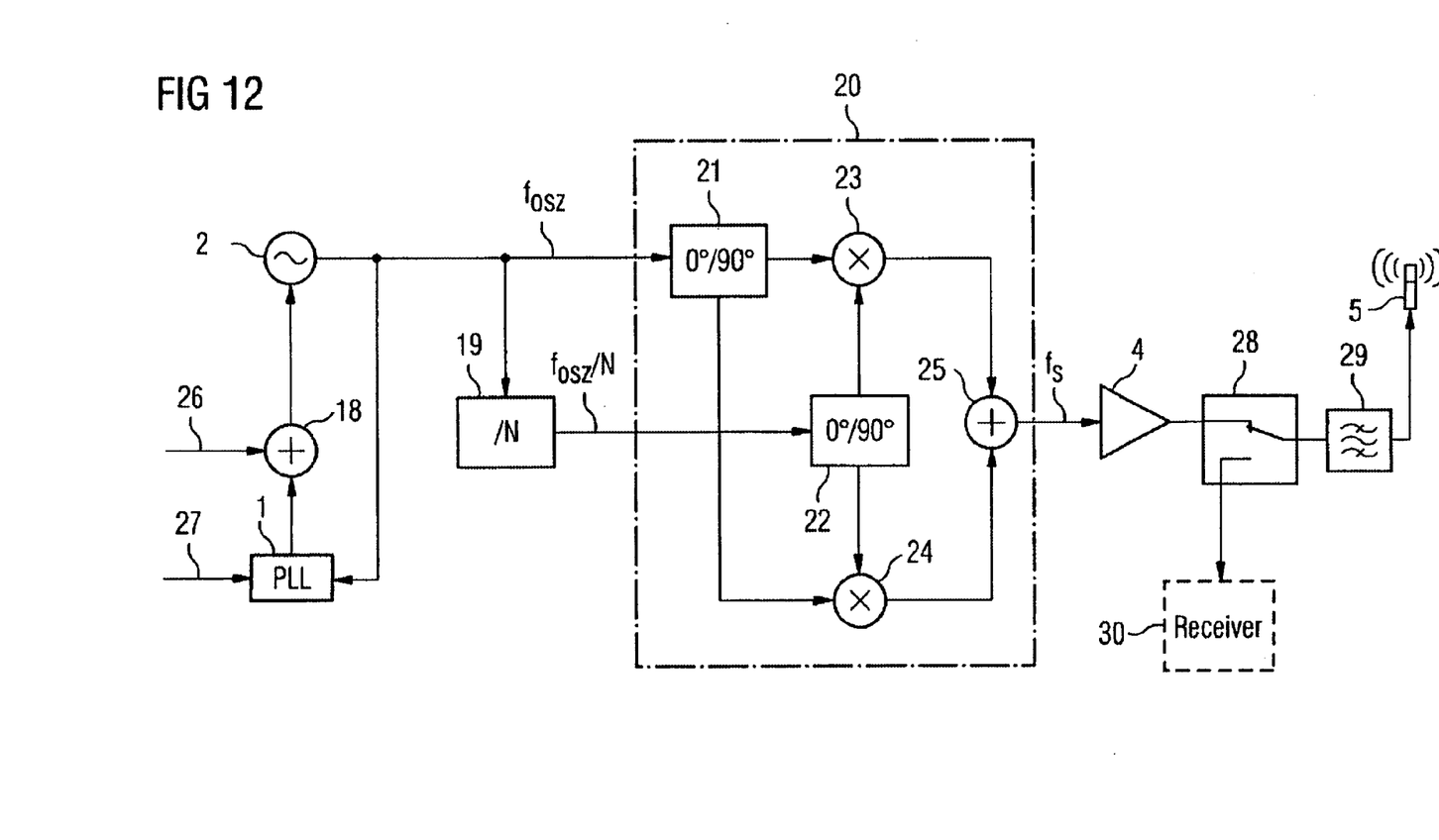
FIG. 12 is a circuit diagram for a circuit with single-sideband mixer and superhet receiver with a transmit/receive band filter.

Such a solution is illustrated by way of example in FIG. 12, which, apart from the transmitting amplifier 4, corresponds to the circuit from FIG. 6. The transmit/receive changeover switch 28, which changes over between the transmit amplifier 4 and the receiver 30 (indicated by broken lines) is arranged subsequently. The aforementioned high-frequency filter 29 is connected between the antenna 5 and the transmit/receive changeover switch 28.

Figure 13:
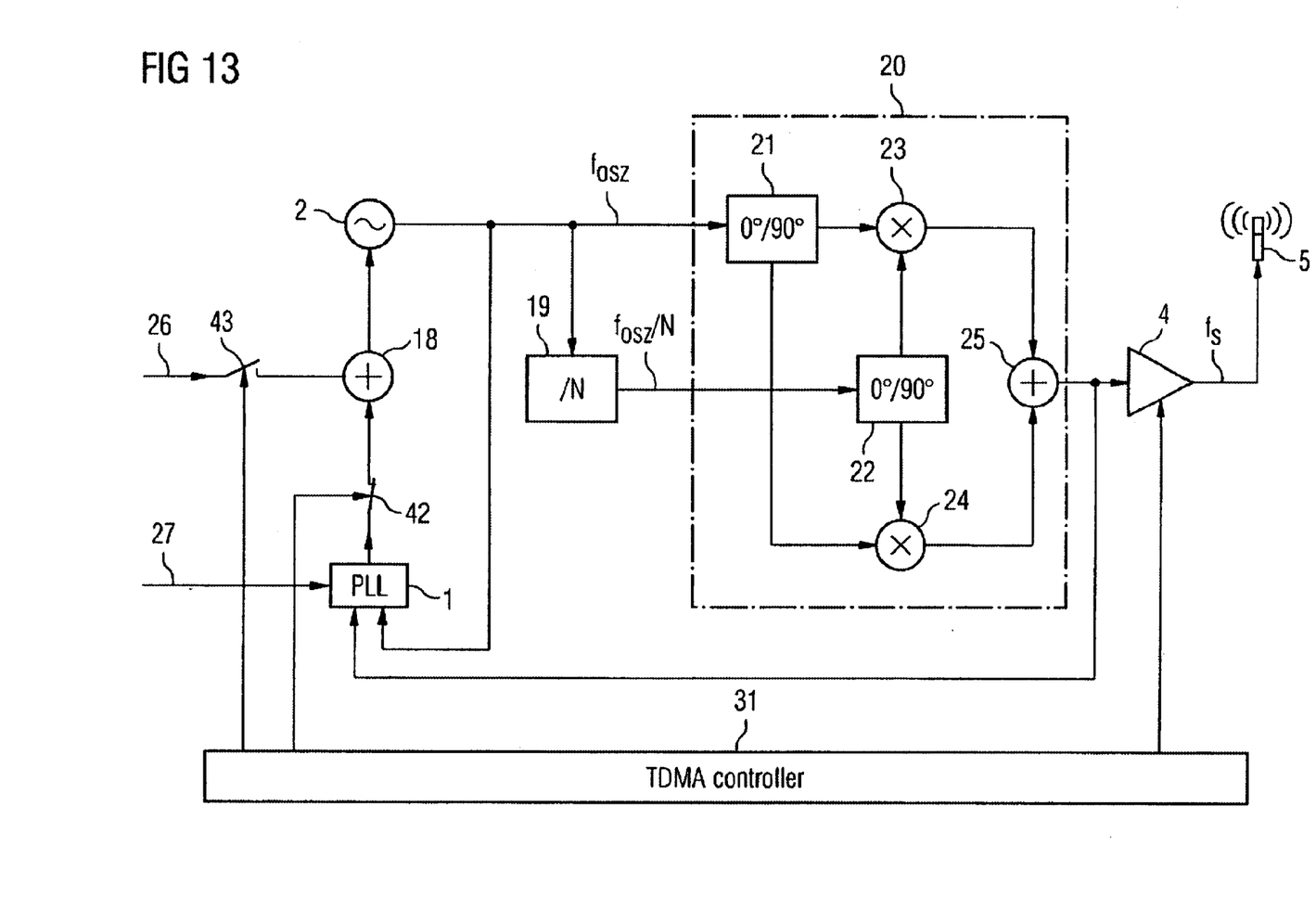
FIG. 13 is a circuit diagram for a circuit with single-sideband mixer and TDMA control device.

Finally, FIG. 13 also shows a circuit according to the invention with a single-sideband mixer 20 as described with respect to FIG. 6. In this case, the TDMA controller 31 however ensures that a data signal for generating a frequency modulation is superimposed on the oscillator control signal at the time of the switching on of the transmit output stage.

This is an arrangement such as is used, for example, in a DECT system with "open-loop modulation method". When the switch 42 is closed, the oscillator 2 is set to the desired channel by means of the PLL circuit 1 during a time slot which is not required for the transmitting/receiving mode. Just before the start of transmission, the switch 42 opens and the control variable which is acquired up to that point is stored in a storage element, not illustrated separately in the FIGURE. A baseband signal for generating the DECT-GFSK (Gaussian frequency shift keying) modulation is superimposed by means of the switch 43 during the emission of the stored control variable. The necessary frequency stability is made possible during the emission by the arrangement according to the invention of the divider and mixer or single-sideband mixer. That is to say, high-frequency effects from the transmitter stage on the oscillator 2 do not bring about any frequency offset after the switching on of the transmitter.

In total, the circuit according to the invention therefore ensures that, on the one hand, the favorable technical requirements of the transmission mixing concept can be utilized and, on the other hand, a high integration density of the circuit, and thus cost-effective manufacture are made possible.

The invention has been described in detail with particular reference to preferred embodiments thereof and examples, but it will be understood that variations and modifications can be effected within the spirit and scope of the invention.

What is claimed is:

1. An electronic circuit for generating a transmit frequency for a Time Division Multiple Access transceiver, comprising:
   a controllable oscillator to generate an output at an oscillator frequency;
   a divider, coupled to said controllable oscillator, to produce an output with a frequency 1/N of the oscillator frequency; and
   a mixer stage having inputs coupled to the outputs of said controllable oscillator and said divider and producing a mixer output used in generating a signal at the transmit frequency which has a nonintegral relationship with the oscillator frequency to minimize disturbance of the oscillator frequency caused by feedback to said controllable oscillator when the signal is intermittently produced to implement Time Division Multiple Access.

2. The electronic circuit as claimed in claim 1, further comprising a band filter, coupled to the output of said mixer stage, to generate the signal at the transmit frequency.

3. The electronic circuit as claimed in claim 2, further comprising a phase locked loop circuit coupled to an input of said controllable oscillator to provide a reference frequency and to receive as an input at least one of the output of said controllable oscillator and the signal at the transmit frequency produced by the band filter.

4. The electronic circuit as claimed in claim 2, further comprising
   a transmit output stage coupled to receive the signal at the transmit frequency from said band filter; and
   a control device, coupled to the output of said mixer stage when said transmit output stage is switched on, to superimpose on an oscillator control signal a data signal to generate a frequency modulation of the output of said controllable oscillator.

5. The electronic circuit as claimed in claim 1, further comprising an amplifier having an input coupled to the output of said mixer stage.

6. The electronic circuit as claimed in claim 1, wherein said controllable oscillator is voltage-controlled.

7. The electronic circuit as claimed in claim 1, wherein said controllable oscillator is current-controlled.

8. The electronic circuit as claimed in claim 1, wherein a reference frequency is supplied externally.

9. The electronic circuit as claimed in claim 1, further comprising a modulator, coupled between said divider and said mixer stage, to supply an IQ modulation baseband signal.

10. The electronic circuit as claimed in claim 9, wherein said modulator performs vector modulation.

11. The electronic circuit as claimed in the preceding claim 10, wherein the output from said divider, phase-shifted by 0°/90°, is used in generation of the vector modulation of said modulator.

12. The electronic circuit as claimed in claim 1, further comprising a modulation stage at an output of said electronic circuit to perform modulation of the transmit signal.

13. The electronic circuit as claimed in claim 9, wherein said modulation stage is a vector modulation stage.

14. An electronic circuit for generating a transmit frequency for a transceiver, comprising:
- a controllable oscillator to generate an output at an oscillator frequency;
- a divider, coupled to said controllable oscillator, to produce an output with a frequency 1/N of the oscillator frequency; and
- a single-sideband mixer having inputs coupled to the outputs of said controllable oscillator and said divider and producing an output used in generating a signal at the transmit frequency.

15. The electronic circuit as claimed in claim 14, wherein said single-sideband mixer is an Image Reject Mixer.

16. The electronic circuit as claimed in claim 14, further comprising a phase locked loop circuit coupled to an input of said controllable oscillator to provide a reference frequency and to receive as an input at least one of the output of said controllable oscillator and the output of said single-sideband mixer.

17. The electronic circuit as claimed in claim 16, further comprising
- a transmit output stage coupled to receive the signal at the transmit frequency from said single-sideband mixer; and
- a control device, coupled to the output of said single-sideband mixer when said transmit output stage is switched on, to superimpose on an oscillator control signal a data signal to generate a frequency modulation of the output of said controllable oscillator.

18. The electronic circuit as claimed in claim 17, wherein said control device is an ASIC component.

19. The electronic circuit as claimed in claim 17, wherein said control device activates two switches alternately, to disconnect the control input of the oscillator upon switching on said transmit stage by said phase locked loop circuit and to supply the data signal for frequency modulation.

20. The electronic circuit as claimed in claim 19, further comprising
- a superimposition receiver, coupled to the output of said controllable oscillator to obtain a superimposition frequency directly from the oscillator frequency; and
- a switch circuit having a first input used during transmission coupled to the output of said mixer stage, a second input used during reception coupled to said controllable oscillator, and an output coupled to said phase locked loop circuit.

* * * * *